(12) United States Patent
Yeom et al.

(10) Patent No.: US 7,361,544 B2
(45) Date of Patent: Apr. 22, 2008

(54) METHOD FOR FABRICATING CAPACITOR IN SEMICONDUCTOR DEVICE

(75) Inventors: Seung-Jin Yeom, Ichon-shi (KR); Deok-Sin Kil, Ichon-shi (KR); Jin-Hyock Kim, Ichon-shi (KR); Ki-Seon Park, Ichon-shi (KR); Han-Sang Song, Ichon-shi (KR); Jae-Sung Roh, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/448,797

(22) Filed: Jun. 8, 2006

(65) Prior Publication Data

US 2007/0148897 A1    Jun. 28, 2007

(30) Foreign Application Priority Data

Dec. 27, 2005    (KR) .................... 10-2005-0130441

(51) Int. Cl.
*H01L 21/8242* (2006.01)
(52) U.S. Cl. .............. 438/239; 438/253; 438/396
(58) Field of Classification Search ........ 438/239, 438/240, 253, 396, 680, 681
See application file for complete search history.

(56) References Cited

U.S. PATENT DOCUMENTS

| | | | |
|---|---|---|---|
| 6,580,111 B2 | 6/2003 | Kim et al. | |
| 6,596,602 B2 | 7/2003 | Iizuka et al. | |
| 6,649,465 B2 | 11/2003 | Iijima et al. | |
| 6,653,198 B2 | 11/2003 | Ahn et al. | |
| 6,664,186 B1 | 12/2003 | Callegari et al. | |
| 6,667,209 B2 * | 12/2003 | Won et al. | 438/253 |
| 2004/0014295 A1 * | 1/2004 | Kim | 438/396 |
| 2004/0224475 A1 | 11/2004 | Lee et al. | |
| 2005/0009336 A1 * | 1/2005 | Seo et al. | 438/681 |
| 2005/0059206 A1 | 3/2005 | Chung et al. | |
| 2005/0063141 A1 | 3/2005 | Jeong et al. | |
| 2006/0046378 A1 * | 3/2006 | Choi et al. | 438/238 |

FOREIGN PATENT DOCUMENTS

| | | |
|---|---|---|
| KR | 10-0272160 B1 | 8/2000 |
| KR | 10-2001-0020025 A | 3/2001 |
| KR | 10-2005-0029814 A | 3/2005 |
| KR | 10-0649973 | 11/2006 |

* cited by examiner

*Primary Examiner*—Zandra V. Smith
*Assistant Examiner*—Toniae M Thomas
(74) *Attorney, Agent, or Firm*—Finnegan, Henderson, Farabow, Garrett & Dunner, L.L.P.

(57) ABSTRACT

A method for fabricating a capacitor in a semiconductor device is provided. The method includes forming an insulation layer over a substrate; flushing a metal source onto the insulation layer to change a characteristic of a surface of the insulation layer to improve adherence of a metal-based material to the surface of the insulation layer; forming a storage node comprising the metal-based material over the flushed insulation layer; and sequentially forming a dielectric layer and a plate electrode over the metal-based storage node.

21 Claims, 7 Drawing Sheets

TOP

MIDDLE

BOTTOM

METHOD FOR FABRICATING CAPACITOR IN SEMICONDUCTOR DEVICE

RELATED APPLICATION

The application is based upon and claims the benefit of priority to Korean patent application No. KR 2005-0130441, filed in the Korean Patent Office on Dec. 27, 2005, the entire contents of which are incorporated herein by reference.

TECHNICAL FIELD

The present invention relates to a method for fabricating a semiconductor device; and, more particularly, to a method for fabricating a capacitor in a semiconductor device.

DESCRIPTION OF RELATED ARTS

As semiconductor devices are becoming highly integrated, securing a required level of capacitance is becoming difficult. To secure the required level of capacitance, the thickness of a dielectric layer needs to be decreased or a high-K dielectric layer is necessarily used.

Currently, in sub-80 nm dynamic random access memories (DRAM), a stack structure of a hafnium oxide ($HfO_2$) layer and an aluminum oxide ($Al_2O_3$) layer is generally used to increase dielectric capacitance without increasing a leakage current. However, it is difficult to obtain an equivalent oxide thickness ($T_{ox}$) less than 12 Å. For capacitors in sub-60 nm DRAM, the equivalent oxide thickness needs to be less than 8 Å, and thus, metal electrodes using ruthenium (Ru), platinum (pt), and iridium (Ir), and dielectric materials having high dielectric constants are generally required.

Figure 1:
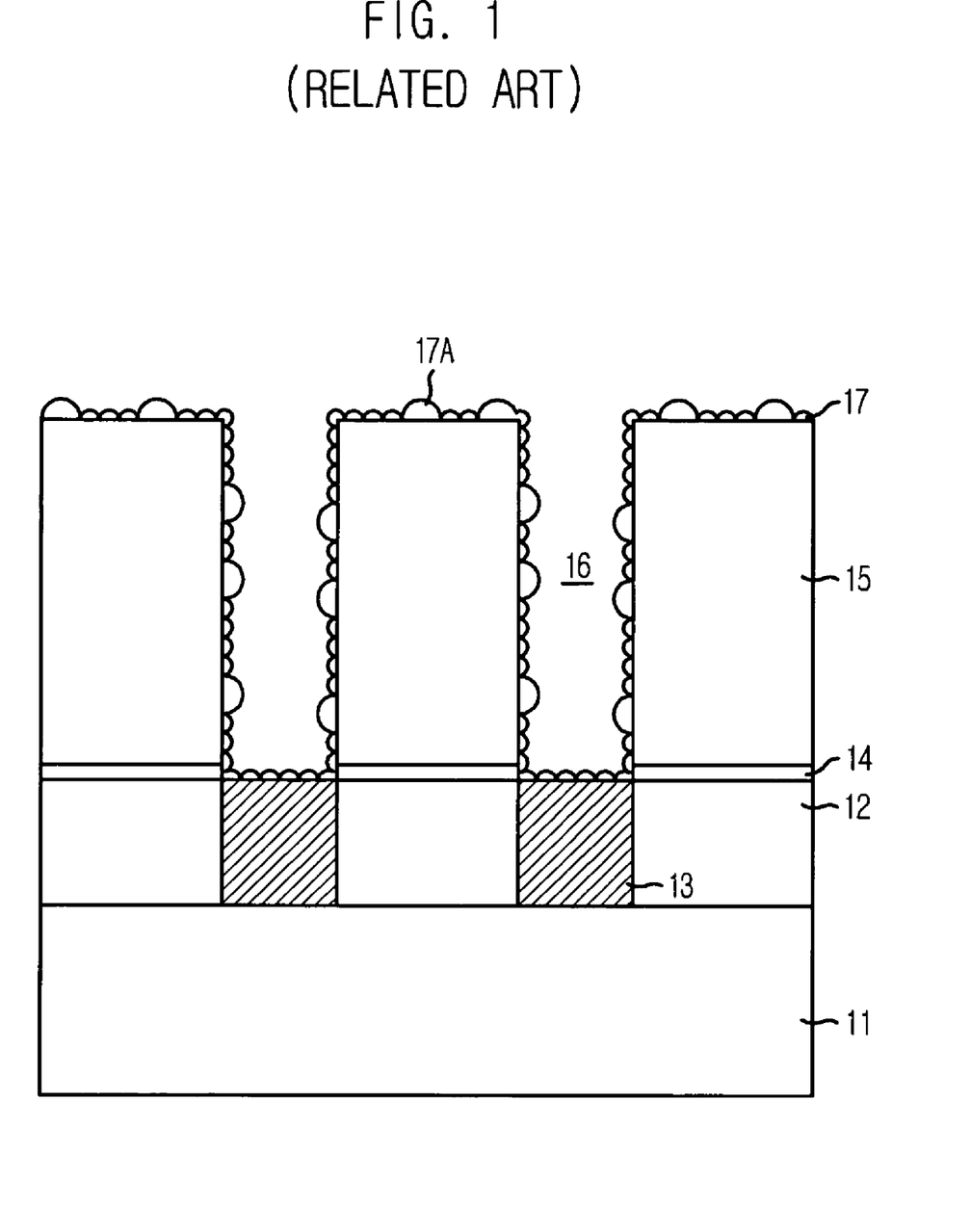
FIG. 1 is a cross-sectional view illustrating a conventional capacitor structure of a semiconductor device.

FIG. 1 is a cross-sectional view illustrating a conventional method for fabricating a capacitor in a semiconductor device.

As illustrated, an inter-layer insulation layer 12 is formed on a substrate 11, and storage node contact plugs 13 are buried in the inter-layer insulation layer 12 such that the storage node contact plugs 13 are connected with respective portions of the substrate 11. The storage node contact plugs 13 are formed of polysilicon. Device isolation regions, word lines, and bit lines, which necessary for configuring DRAM, may be formed prior to the forming of the storage node contact plugs 13.

An etch stop layer 14 and a storage node oxide layer 15 are formed on the storage node contact plugs 13 and the inter-layer insulation layer 12. The storage node oxide layer 15 and the etch stop layer 14 are sequentially etched to form storage node holes 16 exposing the respective storage node contact plugs 13. A storage node 17 is formed on the storage node oxide layer 15 and on sidewalls of the storage node holes 16, and contacts the storage node contact plugs 13 exposed underneath the storage node holes 16. The storage node 17 is formed of ruthenium (Ru).

Figure 2A:
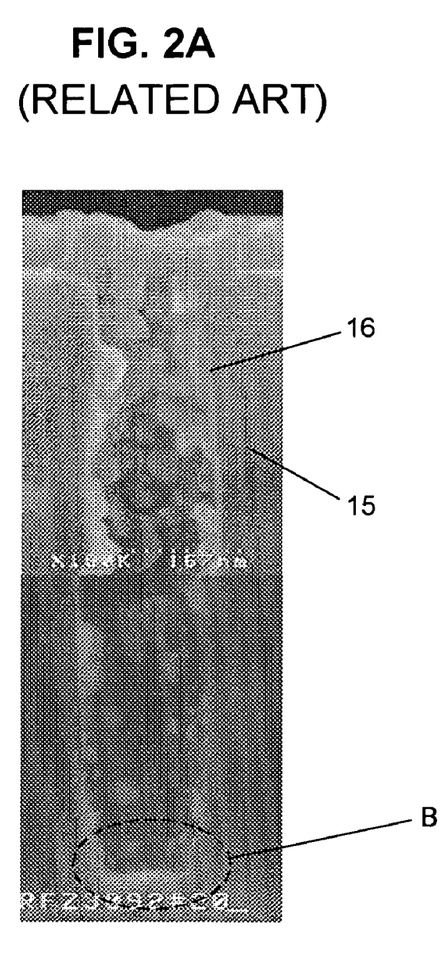
FIGS. 2A and 2B are micrographic images of transmission electron microscopy (TEM) illustrating limitations associated with a conventional fabrication method.
Figure 2B:
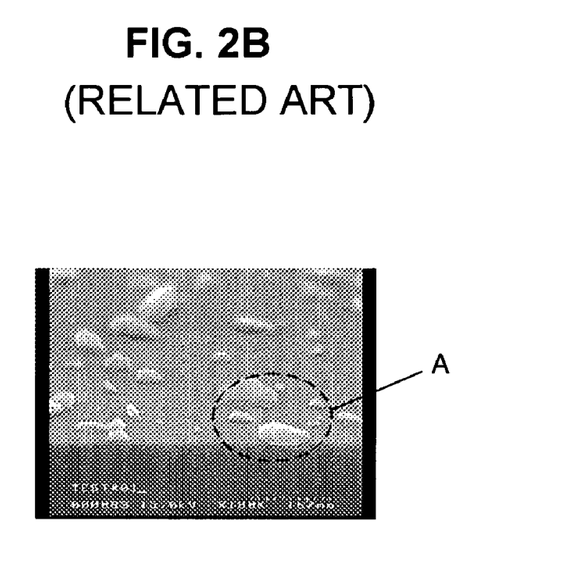

FIGS. 2A and 2B are micrographic images of transmission electron microscopy (TEM) illustrating limitations associated with the method illustrated in FIG. 1. The same reference numerals are used for the same elements described in FIG. 1.

As illustrated, an atomic layer deposition (ALD) method is employed to deposit a Ru layer as the storage node 17 on the storage node oxide layer 15 and on sidewalls of the storage node holes 16. Because a source material is more likely to adhere to areas where the Ru layer is already deposited, the Ru layer may accumulate on certain areas, resulting in islands of Ru as denoted by reference letter 'A' in FIG. 2B. Also, as reference letter 'B' in FIG. 2A denotes, the Ru layer is often not deposited uniformly, and sometimes is deposited inconsecutively, on a bottom portion of the storage node 17.

In the case that a metal such as Ru is used as a storage node material, related processes may be difficult to carry out. For example, in sub-60 nm devices with Ru as the storage node material, a critical dimension (CD) of a storage node contact hole needs to be less than 100 nm and a required aspect ratio is 20 to 1 or higher. In addition to this difficult process condition, a required level of step coverage for the above contact hole with high aspect ratio needs to be higher than 90%, and depositing a specific metal with almost no impurity is required.

To satisfy the above mentioned conditions, many researches have been done to develop a method combined with ALD. However, the current ALD method has a difficulty in that a storage node material is barely deposited on the storage node oxide layer during the initial several hundreds of cycles. That is, the currently employed ALD method has a long incubation cycle, and a chemical vapor deposition (CVD) method usually has a similar limitation. After several hundreds of the cycles, a layer of the storage node material (e.g., Ru) is formed on the entire surface of the storage node oxide layer, and then, the storage node material is deposited at a normal deposition rate of 0.8 Å per cycle.

As described above, even if the deposition takes place, the source material is more likely to adhere to areas where Ru is already deposited and continue to accumulate, resulting in islands of Ru deposition, as labeled by reference numeral 17A in FIG. 1. As a result, roughness may increase and the storage node may not be formed uniformly.

In addition, the source material may not reach the bottom portion of the storage node with high aspect ratio, and thus, depositing the storage node material (e.g. Ru) on the bottom portion of the storage node may take longer than on the other portion thereof. This elongated deposition time may make it difficult to obtain an intended level of step coverage.

In more detail, the storage node oxide layer has —OH group and is therefore hydrophilic. Consequently, a source material for Ru such as bis(ethylcyclopentadienyl)ruthenium [$Ru(EtCp)_2$], particularly, a family of Cp, barely adheres to the storage node oxide layer. As a result, the storage node may grow in island shape.

Using a plasma for the ALD method for forming the storage node employing metal such as Ru may improve the long incubation cycle. However, the implementation of plasma to the ALD method may increase a cycle period, and this increased cycle period may further reduce the throughput of devices.

Furthermore, since the Ru layer deposited on the storage node oxide layer has weak adherence, a peeling event may occur during subsequent processes, resulting in various defects.

SUMMARY

The present invention provides a method for fabricating a capacitor in a semiconductor device suitable for improving a step coverage characteristic while reducing an incubation cycle period when forming a storage node.

Consistent with an aspect of the present invention, there is provided a method for fabricating a capacitor in a semiconductor device, including: forming an insulation layer over a substrate; flushing a metal source onto the insulation layer to change a characteristic of a surface of the insulation layer to improve adherence of a metal-based material to the surface of the insulation; forming a storage node comprising the metal-based material over the flushed insulation layer; and sequentially forming a dielectric layer and a plate electrode over the metal-based storage node.

Consistent with another aspect of the present invention, there is provided a method for fabricating a capacitor in a semiconductor device, including: forming an insulation layer with a hydrophilic surface over a substrate; flushing a metal source onto the insulation layer to change a characteristic of the hydrophilic surface of the insulation layer to improve adherence of a metal-based material to the insulation layer; forming a storage node comprising the metal-based material over the flushed insulation layer; and sequentially forming a dielectric layer and a plate electrode over the metal-based storage node.

Additional features and advantages of the invention will be set forth in part in the description which follows, and in part will be apparent from that description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The above and other features of the present invention will become better understood with respect to the following description of the exemplary embodiments given in conjunction with the accompanying drawings, in which.

DETAILED DESCRIPTION OF THE INVENTION

Hereinafter, exemplary embodiments of the present invention will be described in detail with reference to the accompanying drawings.

FIGS. 3A to 3F are cross-sectional views illustrating a method for fabricating a capacitor in a semiconductor device consistent with an embodiment of the present invention.

Figure 3A:
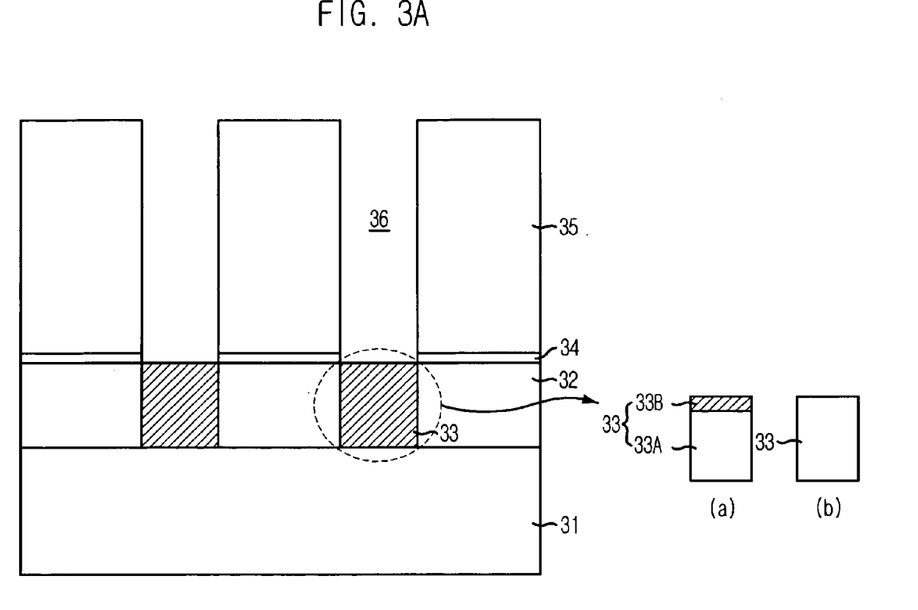
FIGS. 3A to 3F are cross-sectional views illustrating a method for fabricating a capacitor in a semiconductor device consistent with an embodiment of the present invention.

Referring to FIG. 3A, an inter-layer insulation layer 32 is formed over a substrate 31, and storage node contact plugs 33 are formed in inter-layer insulation layer 32 and in contact with certain portions of the substrate 31. Although not illustrated, prior to forming the storage node contact plugs 33, device isolation regions, bit lines, and word lines necessary for configuring DRAM are formed.

The storage node contact plugs 33 include polysilicon, tungsten or titanium. The section (a) of FIG. 3A illustrates the case when the storage node contact plugs 33 include polysilicon or tungsten, while the section (b) of FIG. 3A illustrates the case when the storage node contact plugs 33 include titanium. For instance, as illustrated in the section (a) of FIG. 3A, when an etch-back process is performed on this plug material, the plug material is recessed to a certain depth, and a titanium silicide layer 33B may be formed over the recessed plug material 33A to form ohmic contacts.

An etch stop layer 34 and a first storage node layer 35 are formed over the storage node contact plugs 33 and the inter-layer insulation layer 32. The first storage node layer 35 includes an oxide-based material. The first storage node layer 35 is to provide holes for forming cylindrical storage nodes and is hydrophilic by having —OH terminated group. The etch stop layer 34 serves as an etch barrier layer to prevent an etching of a bottom structure when the first storage node layer 35 is etched. The first storage node layer 35 and the etch stop layer 34 are sequentially etched to form storage node holes 36 exposing the storage node contact plugs 33.

Figure 3B:
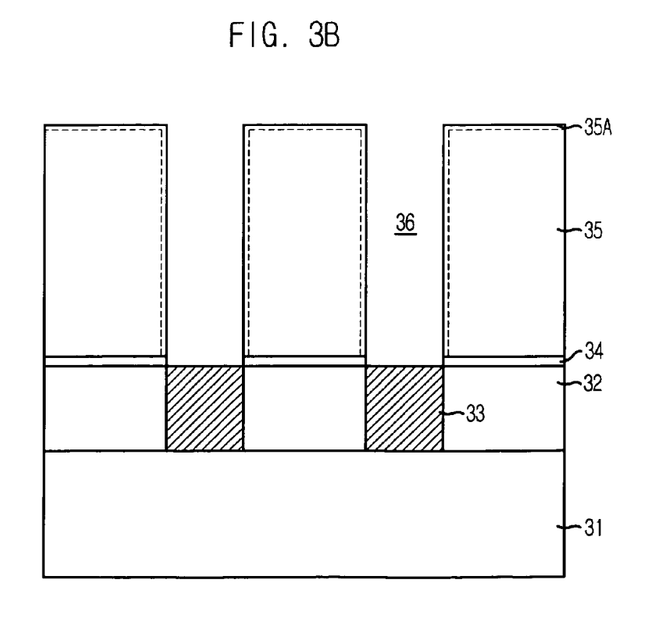

Referring to FIG. 3B, a metal source flushing process is performed on the above entire surface of the above substrate structure to improve a property of the first storage node layer 35, which is hydrophilic. Herein, the first storage node layer 35 subjected to the metal source flushing process will be referred to as "second storage node layer" and denoted with reference numeral 35A.

The flushing process is a pretreatment implemented before storage nodes are subsequently formed within a CVD or ALD chamber. More specifically, the flushing process is performed at approximately 100° C. to approximately 500° C. for approximately 1 second to approximately 500 seconds. The flushing process can be performed continuously for approximately 1 second to approximately 500 seconds, or performed discontinuously multiple times, each for several seconds determined by the division of the entire performance period ranging from approximately 1 second to approximately 500 seconds.

The metal source used for the flushing process includes a metal-based organic source. The metal is selected from a group consisting of titanium (Ti), tantalum (Ta), niobium (Nb), vanadium (V), zirconium (Zr), and hafnium (Hf). In more detail, the metal source includes a Ti precursor source, a Ta precursor source, $HfCl_4$, $TiCl_4$, or $AlCl_3$. The Ti precursor source is selected from a group consisting of tetrakis ethylmethylamido titanium (TEMAT), tetrakis dimethylamino titanium (TDMAT), tetrakis diethylamido titanium (TDEAT), and titanium tetraisopropoxide (TTIP), and the Ta precursor source is selected from a group consisting of TBTEMT, $Ta(N(C_2H_5)CH_3)_5$ (PEMATa), and polyethylene terephthlate (PET).

Performing the metal source flushing process on the hydrophilic first storage node layer 35 causes a property of the first storage node layer 35 to change such that metal can easily adhere to the resultant second storage node layer 35A. As a result, a source material for subsequent storage nodes (e.g., Ru) can be easily adsorbed on the second storage node layer 35A, and thus, the storage nodes can be formed uniformly without the incubation cycle.

Depending on the metal source for the flushing process, metal elements may remain on the interface between the second storage node layer 35A and the storage node including Ru. However, the remaining metal elements can be removed through a cleaning process after the formation of the cylindrical storage nodes. Thus, the remaining metal elements do not affect properties of subsequent capacitors. Also, if the flushing process is performed using a metal source in consideration of a dielectric material, which will be formed after the formation of the storage nodes, the selected metal source can be used regardless of the removal of the remnants after the cylindrical storage node formation.

Figure 3C:
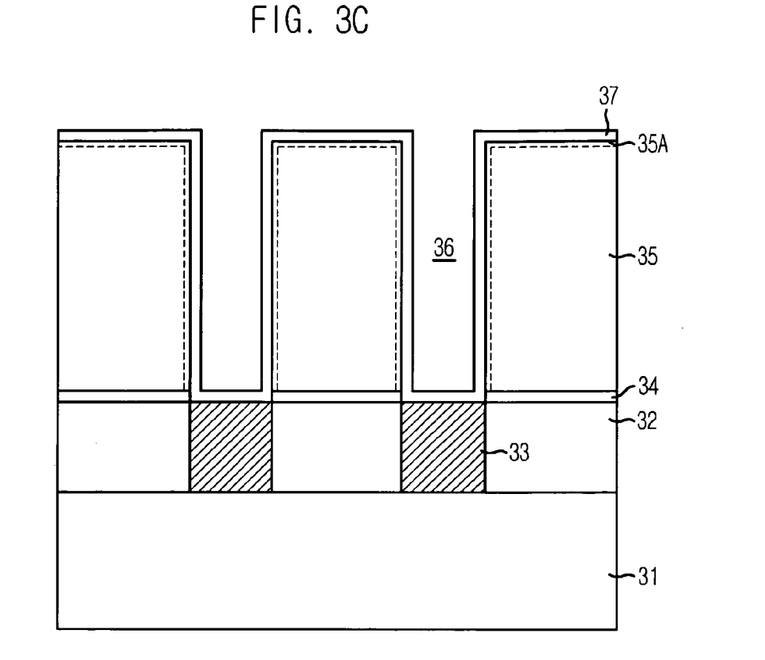

Referring to FIG. 3C, a conductive layer 37 is formed over the second storage node layer 35A with a changed surface characteristic by the flushing process. The conductive layer 37 includes Ru, platinum (Pt), or iridium (Ir).

The conductive layer 37 is formed by employing one selected from a group consisting of an atomic layer deposition (ALD) method, a plasma enhanced atomic layer deposition (PEALD) method, a combined method of ALD and chemical vapor deposition (CVD), an ALD method with plasma treatment, and a cyclic CVD method.

The typical ALD method includes a unit cycle of supplying a source gas, purging out the non-reacted source gas, supplying a reaction gas, and purging out the non-reacted reaction gas, and this unit cycle is repeated a certain number of times.

As for the combined method of ALD and CVD, a source gas and a reaction gas are simultaneously supplied, and a CVD reaction is performed for a short period. Afterwards, a purging operation is performed, and then, an annealing process proceeds while only the reaction gas is supplied.

As for the ALD with plasma treatment, among the above described typical ALD steps, the plasma treatment is performed while only the reaction gas is supplied. The plasma treatment is performed under a condition of: a plasma power ranging from approximately 10 W to approximately 1,500 W and a temperature ranging from approximately 150° C. to approximately 500° C. For the plasma treatment, the reaction gas is selected from a group consisting of $O_2$, $NH_3$, $N_2O$, $N_2H_4$, $(CH_3)_2NH_2$, $H_2$, and a combination thereof.

The cyclic CVD is one method of reducing the purging time in the typical ALD method to approximately 0. In more detail, the CVD reaction may occur in every ending interval of the ALD steps, and thus, the cycle time can be shortened and a deposition rate can be improved. While the reaction gas is continuously supplied and the source gas is discontinuously supplied, the deposition takes place using the CVD method when the source gas is supplied.

In the above cyclic CVD method, when the reaction gas is supplied, a plasma can be used. As compared with the typical ALD or PEALD method, the cycle time can be shortened, and a deposition rate of a thin film can be increased since the CVD method is employed periodically. Since the cyclic CVD method includes the step of removing reacted materials within the unit cycle, characteristics of the deposited thin film are better than those of the thin film deposited by the typical CVD method.

After the conductive layer 37 is formed, the plasma treatment can be additionally performed after the ALD method in every cycle to improve characteristics of the thin film, i.e., the conductive layer 37.

Figure 3D:
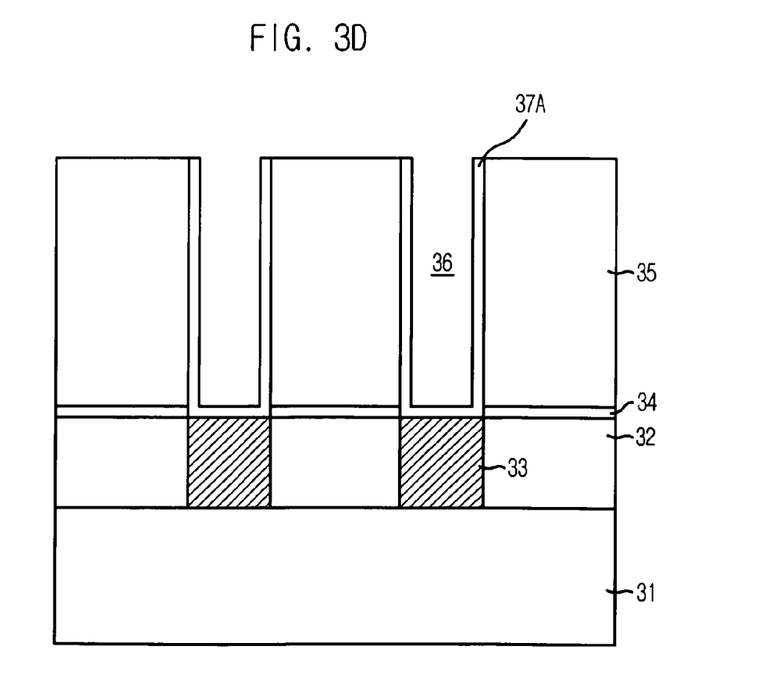

Referring to FIG. 3D, an isolation process is performed to isolate the conductive layer 37 for forming the above mentioned cylindrical storage nodes 37A inside the storage node holes 36. The isolation process is performed by employing a chemical mechanical polishing (CMP) process or an etch-back process, which removes portions of the conductive layer 37 disposed over the second storage node layer 35A but retains portions of the conductive layer 37 in the storage node holes 36.

Because impurities including a polishing agent and etch particles produced during the isolation process may adhere to the cylindrical storage nodes 37A, a photoresist layer with a good step coverage characteristic may be first filled into the storage node holes 36 and then, the isolation process is performed to expose the second storage node layer 35A. Afterwards, an ashing process is performed to remove the photoresist layer.

Figure 3E:
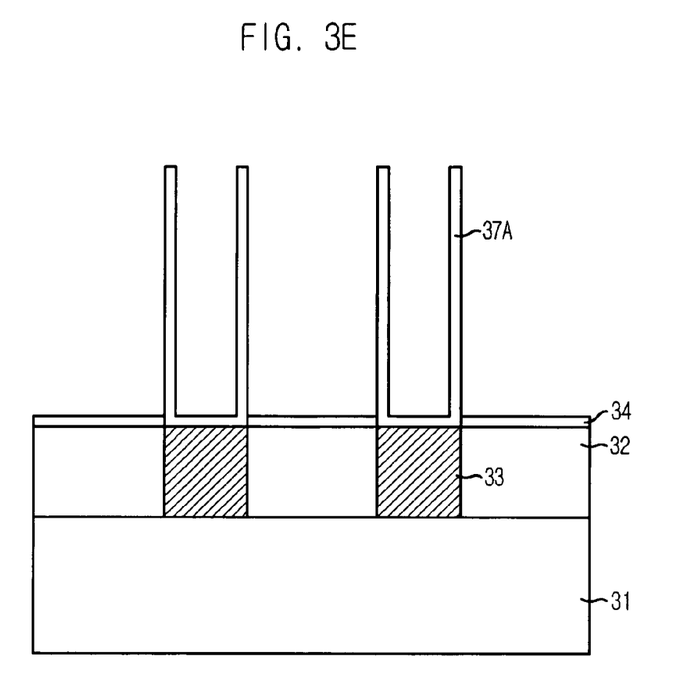

Referring to FIG. 3E, the second storage node layer 35A is subjected to a wet etching process, more particularly, a full dip out process to expose inner and outer walls of the storage nodes 37A. The full dip out process uses a solution of Hf, and the etch stop layer 34 underneath the second storage node layer 35A is not etched since the etch stop layer 34 includes a silicon nitride material having a high etch selectivity to the oxide-based second storage node layer 35A during the wet etching process.

Figure 3F:
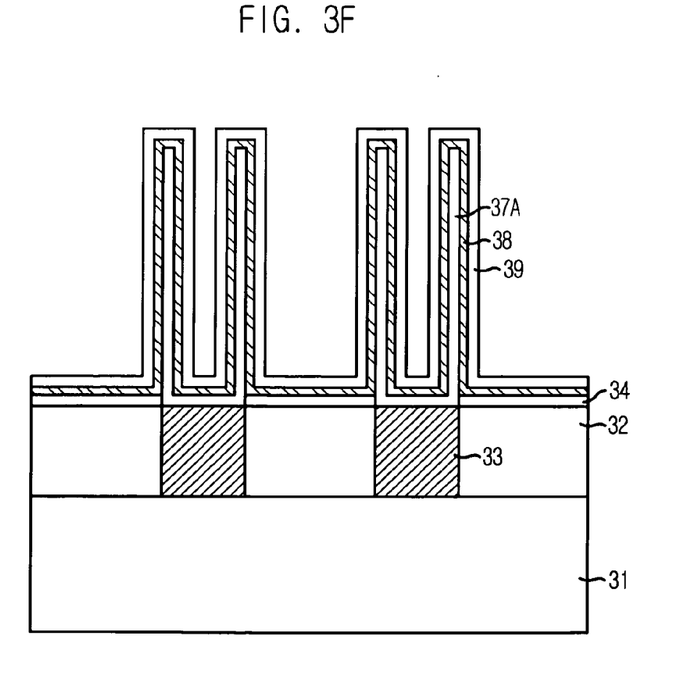

Referring to FIG. 3F, a dielectric layer 38 and a plate electrode 39 are sequentially formed over the storage nodes 37A. The dielectric layer 38 includes a single layer or multiple layers of a material selected from a group consisting of $HfO_2$, $Al_2O_3$, $ZrO_2$, $La_2O_3$, $Ta_2O_5$, $TiO_2$, $BaSrTiO_3$ (BST), $SrTiO_3$, PZT, BLT, SPT, and $Bi_2Ti_2O_7$.

The dielectric layer 38 comprises a mixture layer such as $Hf_xAl_yO_z$ obtained by employing a sputtering method, a CVD method or an ALD method. In the case that the dielectric layer 38 is formed in a complex structure, the unit cycle of the ALD method is defined as follows: $[(Hf/N_2/O_3/N_2)_m(Al/N_2/O_3/N_2)_n]$, where m and n are less than approximately 10.

The mixture layer can also be obtained by performing a PECVD method using a plasma, and in the ALD steps, the step of supplying $O_3$ gas is replaced with the step of supplying $O_2$ gas to be used as a plasma.

After the dielectric layer 38 is formed, a post treatment is performed at approximately 200° C. to approximately 500° C. using $O_2$ gas, $O_3$ gas or $O_2$ plasma.

The plate electrode 39 includes Ru, Pt or Ir. The plate electrode 39 is obtained by performing one selected from a group consisting of an ALD method, a PEALD method, a combined method of ALD and CVD, an ALD method with plasma treatment, and a cyclic CVD method.

After the plate electrode 39 is formed, the plasma treatment can be additionally performed after the ALD method in every cycle to improve characteristics of the thin film, i.e., the plate electrode 39.

Figure 4A:
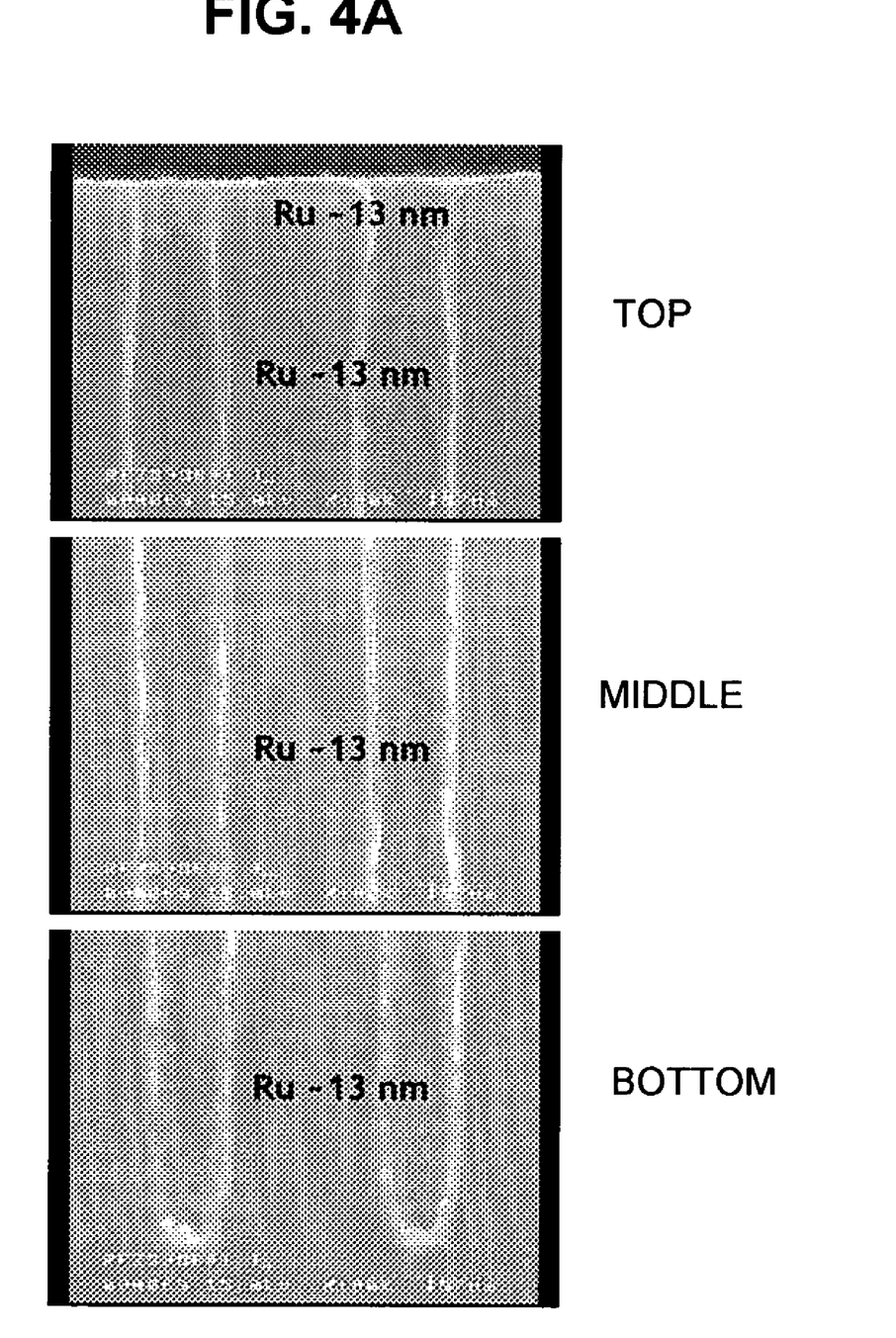
FIGS. 4A to 4C are micrographic images of TEM illustrating improvements achieved by the fabrication method consistent with the embodiment of the present invention.
Figure 4B:
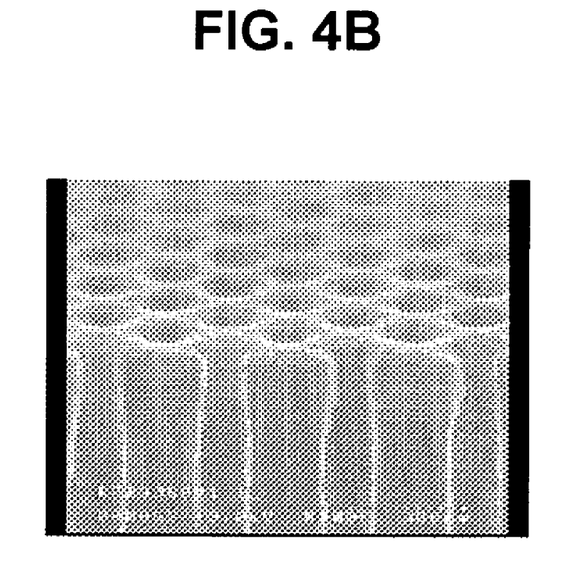
Figure 4C:
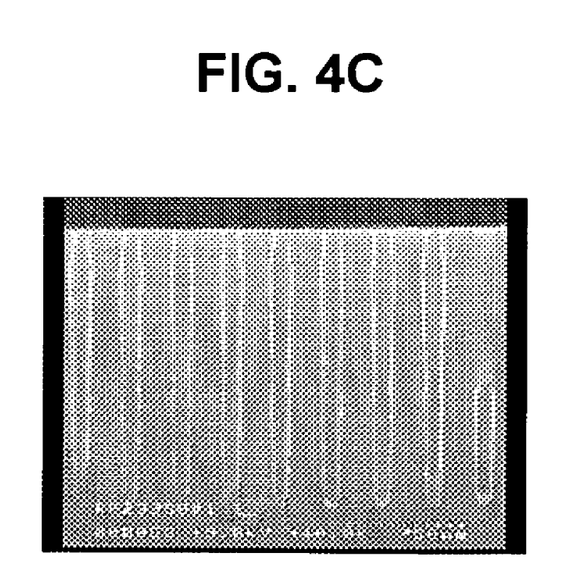

FIGS. 4A to 4C are micrographic images of transmission electron microscopy (TEM) illustrating improvements achieved by the fabrication method consistent with the embodiment of the present invention.

Referring to FIG. 4A, the cross-sectioned view of storage nodes divided into top, middle and bottom parts shows that the storage nodes are formed with a uniform thickness. The uniform thickness of the storage nodes is achieved through a flushing process using TBTEMT, and thus, an improved step coverage characteristic of the storage nodes can be obtained.

Referring to FIGS. 4B and 4C, cylindrical storage nodes and a cross-sectional view thereof are illustrated. A level of the step coverage characteristic is approximately 100%.

As described above, after the storage node holes are formed, the flushing process is performed on the storage node layer that has a hydrophilic surface to improve a surface characteristic of the storage node layer before forming the storage nodes using metal.

Hence, in the ALD method for forming the storage nodes including Ru, a source material can adhere easily onto the storage node layer. As a result, the storage nodes can be formed with a uniform thickness, and it is possible to provide a thin film of the storage node material (e.g., Ru) having an excellent step coverage characteristic without decreasing the throughput. Depending on the source material subjected to the flushing process, the source material, which is generally a metal-based material, remains on the interface between the storage node layer including an oxide-based material and the storage nodes including Ru. Such source material remnants can be removed through a cleaning process after the cylindrical storage nodes are formed, and thus, capacitor characteristics are not affected.

Although the cylindrical storage nodes are exemplified in the exemplary embodiments, the storage nodes can be formed in other structures such as a concave structure.

On the basis of the exemplary embodiments of the present invention, when capacitors of DRAM with the feature size less than approximately 60 nm are fabricated, the incubation cycle of the storage nodes including Ru can be reduced, and the step coverage characteristic of the storage nodes can be improved. As a result, the throughput of devices and device characteristics can be improved, and an adherence characteristic can also be improved, thereby reducing defect generation during a subsequent capacitor formation process. This effect provides stability of the capacitor manufacturing processes, which further increase device yield and cost-effectiveness.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a capacitor in a semiconductor device, comprising:
    forming an insulation layer over a substrate;
    flushing a surface of the insulation layer using a metal source to improve adherence of a metal-based material to the surface of the insulation layer;
    forming a storage node comprising the metal-based material over the flushed insulation layer; and
    sequentially forming a dielectric layer and a plate electrode over the metal-based storage node.

2. The method of claim 1, wherein flushing the metal source is performed in one of a chemical vapor deposition (CVD) chamber and an atomic layer deposition (ALD) chamber.

3. The method of claim 2, wherein flushing the metal source is performed continuously for approximately 1 second to approximately 500 seconds or performed discontinuously multiple times, each for several seconds determined by the division of the entire performance period ranging from approximately 1 second to approximately 500 seconds.

4. The method of claim 3, wherein flushing the metal source is performed at approximately 100° C. to approximately 500° C.

5. The method of claim 1, wherein the metal source includes a metal-based organic material including metal selected from a group consisting of titanium (Ti), tantalum (Ta), niobium (Nb), vanadium (V), zirconium (Zr), and hafnium (Hf).

6. The method of claim 5, wherein the metal source includes one selected from a Ti precursor source, a Ta precursor source, $HfCl_4$, $TiCl_4$, and $AlCl_3$, wherein the Ti precursor source is selected from a group consisting of tetrakis ethylmethylamido titanium (TEMAT), tetrakis dimethylamino titanium (TDMAT), tetrakis diethylamido titanium (TDEAT), and titanium tetraisopropoxide (TTIP), and the Ta precursor source is selected from a group consisting of TBTEMT, $Ta(N(C_2H_5)CH_3)_5$ (PEMATa), and polyethylene terephthlate (PET).

7. The method of claim 1, further comprising forming holes in the insulation layer.

8. The method of claim 1, wherein forming the storage node comprises forming the metal-based storage node in one of a concave structure and a cylinder structure.

9. The method of claim 8, wherein the metal-based storage node includes one selected from a group consisting of ruthenium (Ru), platinum (Pt), and iridium (Ir).

10. The method of claim 1, wherein the insulation layer includes an oxide-based layer with a hydrophilic surface.

11. The method of claim 1, wherein the plate electrode includes one selected from a group consisting of Ru, Pt, and Ir.

12. A method for fabricating a capacitor in a semiconductor device, comprising:
    forming an insulation layer with a hydrophilic surface over a substrate;
    flushing a metal source onto the insulation layer to change a characteristic of the hydrophilic surface of the insulation layer to improve adherence of a metal-based material to the insulation layer;
    forming a storage node comprising the metal-based material over the flushed insulation layer; and
    sequentially forming a dielectric layer and a plate electrode over the metal-based storage node.

13. The method of claim 12, wherein flushing the metal source is performed in one of a chemical vapor deposition (CVD) chamber and an atomic layer deposition (ALD) chamber.

14. The method of claim 13, wherein flushing the metal source is performed continuously for approximately 1 second to approximately 500 seconds or performed discontinuously multiple times, each for several seconds determined by the division of the entire performance period ranging from approximately 1 second to approximately 500 seconds.

15. The method of claim 14, wherein flushing the metal source is performed at approximately 100° C. to approximately 500° C.

16. The method of claim 12, wherein the metal source includes a metal-based organic material including metal selected from a group consisting of titanium (Ti), tantalum (Ta), niobium (Nb), vanadium (V), zirconium (Zr), and hafnium (Hf).

17. The method of claim 16, wherein the metal source includes one selected from a Ti precursor source, a Ta precursor source, $HfCl_4$, $TiCl_4$, and $AlCl_3$, wherein the Ti precursor source is selected from a group consisting of tetrakis ethylmethylamido titanium (TEMAT), tetrakis dimethylamino titanium (TDMAT), tetrakis diethylamido titanium (TDEAT), and titanium tetraisopropoxide (TTIP), and the Ta precursor source is selected from a group consisting of TBTEMT, $Ta(N(C_2H_5)CH_3)_5$ (PEMATa), and polyethylene terephthlate (PET).

18. The method of claim 12, further comprising forming holes in the insulation layer.

19. The method of claim 18, wherein the insulation layer includes an oxide-based material.

20. The method of claim 12, wherein forming the storage node comprises forming the metal-based storage node in one of a concave structure and a cylinder structure.

21. The method of claim 20, wherein the metal-based storage node includes one selected from a group consisting of ruthenium (Ru), platinum (Pt), and iridium (Ir).

* * * * *

UNITED STATES PATENT AND TRADEMARK OFFICE
CERTIFICATE OF CORRECTION

| | |
|---|---|
| PATENT NO. | : 7,361,544 B2 |
| APPLICATION NO. | : 11/448797 |
| DATED | : April 22, 2008 |
| INVENTOR(S) | : Seung-Jin Yeom |

It is certified that error appears in the above-identified patent and that said Letters Patent is hereby corrected as shown below:

Claim 12, col. 8, line 14, "forming an insulation layer with a hydrophilic surface" should read --forming an insulation layer having a hydrophilic surface--.

Claim 12, col. 8, lines 16-18, "flushing a metal source onto the insulation layer to change a characteristic of the hydrophilic surface of the insulation layer improve adherence of a metal-based" should read --flushing the hydrophilic surface of the insulation layer using a metal source to improve adherence of a metal-based--.

Signed and Sealed this

Tenth Day of February, 2009

JOHN DOLL
*Acting Director of the United States Patent and Trademark Office*